United States Patent
Yap

(10) Patent No.: US 9,595,509 B1
(45) Date of Patent: Mar. 14, 2017

(54) STACKED MICROELECTRONIC PACKAGE ASSEMBLIES AND METHODS FOR THE FABRICATION THEREOF

(71) Applicant: FREESCALE SEMICONDUCTOR INC., Austin, TX (US)

(72) Inventor: Weng F. Yap, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 2 days.

(21) Appl. No.: 14/847,438

(22) Filed: Sep. 8, 2015

(51) Int. Cl.
*H01L 23/02* (2006.01)
*H01L 25/10* (2006.01)
*H01L 25/00* (2006.01)

(52) U.S. Cl.
CPC ............ *H01L 25/105* (2013.01); *H01L 25/50* (2013.01); *H01L 2225/1058* (2013.01)

(58) Field of Classification Search
CPC ................. H01L 23/3114; H01L 33/48; H01L 2023/4031
USPC .................. 257/686, 691, 693, 700
See application file for complete search history.

(56) References Cited

U.S. PATENT DOCUMENTS

| | | | |
|---|---|---|---|
| 5,907,477 A * | 5/1999 | Tuttle | H01L 23/24 174/260 |
| 6,507,115 B1 | 1/2003 | Hofstee et al. | |
| 7,445,968 B2 * | 11/2008 | Harrison | H01L 23/3677 257/660 |
| 8,222,538 B1 | 7/2012 | Yoshida et al. | |
| 8,557,629 B1 | 10/2013 | Kim et al. | |
| 8,569,882 B2 * | 10/2013 | Ko | H01L 25/03 257/686 |
| 2013/0154091 A1 | 6/2013 | Wright et al. | |
| 2015/0279815 A1 * | 10/2015 | Do | H01L 25/0655 257/737 |
| 2015/0287708 A1 * | 10/2015 | Lin | H01L 21/6836 438/109 |

* cited by examiner

*Primary Examiner* — Tan N Tran

(57) ABSTRACT

Stacked microelectronic package assemblies are provided, as are methods for producing stacked microelectronic package assemblies. In one embodiment, the stacked microelectronic package assembly includes a base package layer onto which a stacked bridge device is stacked. The base package layer includes, in turn, a first microelectronic package and a second microelectronic package positioned laterally adjacent the first microelectronic package. The stacked bridge device extends over the first and second microelectronic packages. A first terminal of the stacked bridge device is soldered to or otherwise electrically joined to a first backside contact of the first microelectronic package, and a second terminal of the stacked bridge device is soldered to or otherwise electrically joined to a second backside contact of the second microelectronic package.

20 Claims, 2 Drawing Sheets

STACKED MICROELECTRONIC PACKAGE ASSEMBLIES AND METHODS FOR THE FABRICATION THEREOF

TECHNICAL FIELD

Embodiments of the present invention relate generally to microelectronic packaging and, more particularly, to stacked microelectronic package assemblies and methods for the manufacture thereof.

BACKGROUND

Microelectronic packages and package assemblies are now commonly produced to include multiple interconnected devices. Advancements in microelectronic packaging have brought about significant improvements in package functionality, device density, and package size. Nonetheless, still further improvements in these key areas continue to be sought. Microelectronic packages containing multiple interconnected devices embedded in a single molded body (referred to herein as "System-in-Packages" or, more simply, "SiPs") can be produced with high device densities and relatively compact footprints. This is particularly true when the SiP is produced to have a three dimensional (3D) package architecture; that is, to contain multiple levels or layers of devices, which overlap as taken along an axis extending parallel to the package centerline.

SiPs are, however, associated with certain limitations. For example, SiPs can suffer from relatively high heat concentrations and poor thermal dissipation, which can reduce the functionality of semiconductor die within the SiP. If this is overly problematic, an alternative 3D package architecture can be chosen. For example, a so-called "Package-on-Package" or "PoP" configuration can be utilized wherein a first microelectronic package is stacked on a second microelectronic package and interconnected therewith. Relative to 3D SiPs, PoP assemblies often provide improved heat dissipation with a corresponding penalty in device density. Design rules and conventional practices for producing PoP assemblies can, however, limit the options available for interconnecting the stacked packages, which, in turn, can place undesired restrictions on the functionality of the PoP assembly.

BRIEF DESCRIPTION OF THE DRAWINGS

At least one example of the present invention will hereinafter be described in conjunction with the following figures, wherein like numerals denote like elements, and.

Figure 1:
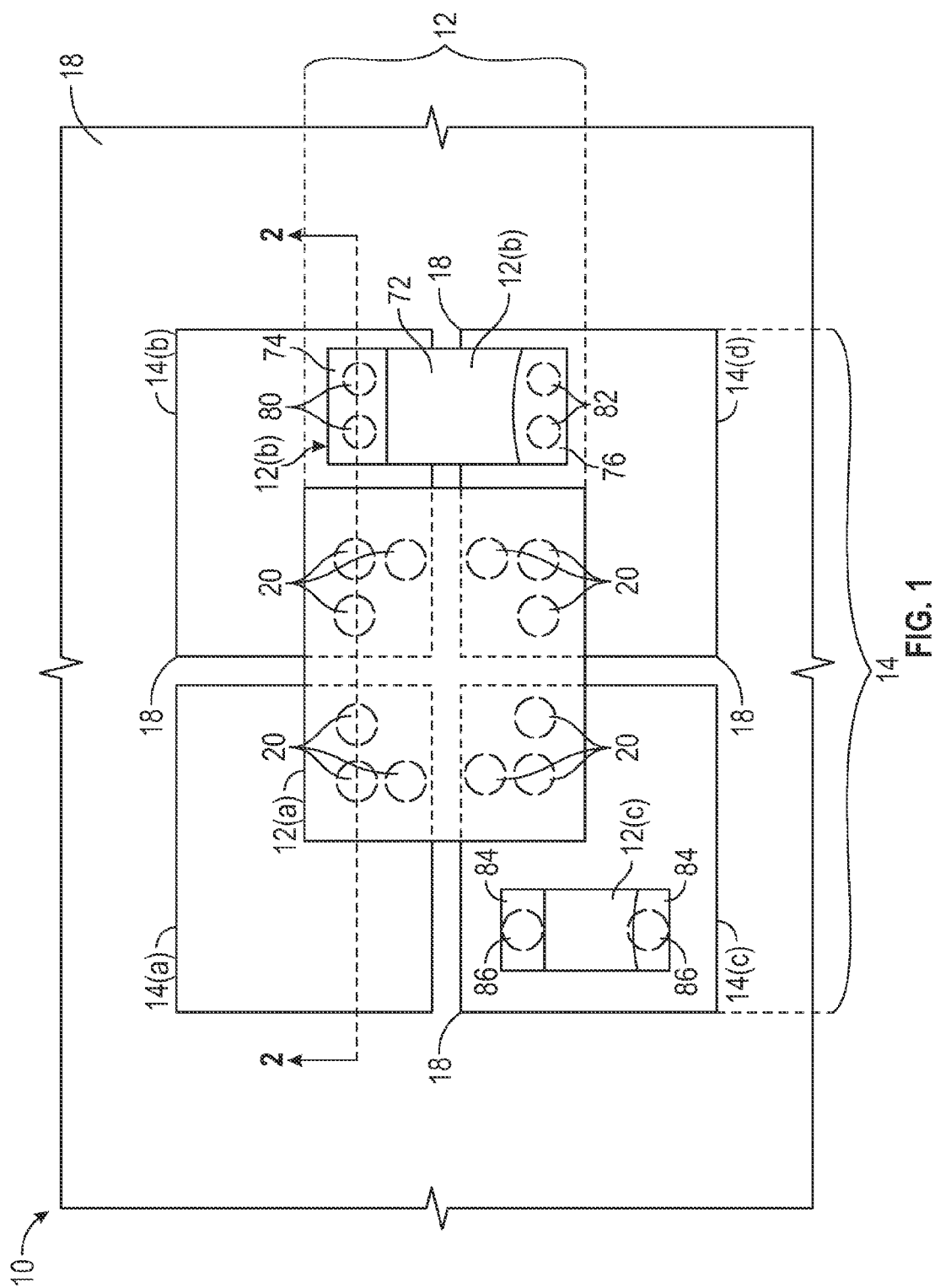
FIGS. 1 and 2 are planform and cross-sectional views, respectively, of a stacked microelectronic package assembly including at least one bridge device stacked across and electrically joined (e.g., soldered) to multiple microelectronic packages contained within a base package layer, as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes exemplary embodiments of a stacked microelectronic package assembly including a base package layer over which one or more microelectronic devices are stacked. At least one of the microelectronic devices stacked onto the base package layer extends over at least two of the base layer packages and is electrically joined to each by, for example, a solder connection. The microelectronic devices that are stacked and interconnected in this manner (that is, soldered or otherwise electrically joined to at least two of the base layer packages) are referred to herein as "stacked bridge devices." The stacked bridge devices can be additional microelectronic packages, discrete Surface Mount Devices (SMDs), Microelectromechanical systems (MEMS) devices, optical devices, or various other microelectronic devices (e.g., a prefabricated antenna structures). The base layer packages can be, for example, Fan-Out Wafer Level Packages (FO-WLPs) including backside contacts to which terminals of the stacked bridge device are soldered or otherwise electrically joined. In this manner, microelectronic package assemblies can be produced to have 3D package architectures combining multiple die-containing packages and possibly other devices (e.g., SMDs) to provide high levels of functionalities, while permitting efficient heat dissipation from the package assembly. Additionally, as the number, disposition, and type of the stacked bridge devices and the base layer packages can be varied to suite a particular application or purpose, embodiments of the below-described stacked microelectronic package assembly further provide a relatively high degree of design flexibility.

Figure 2:
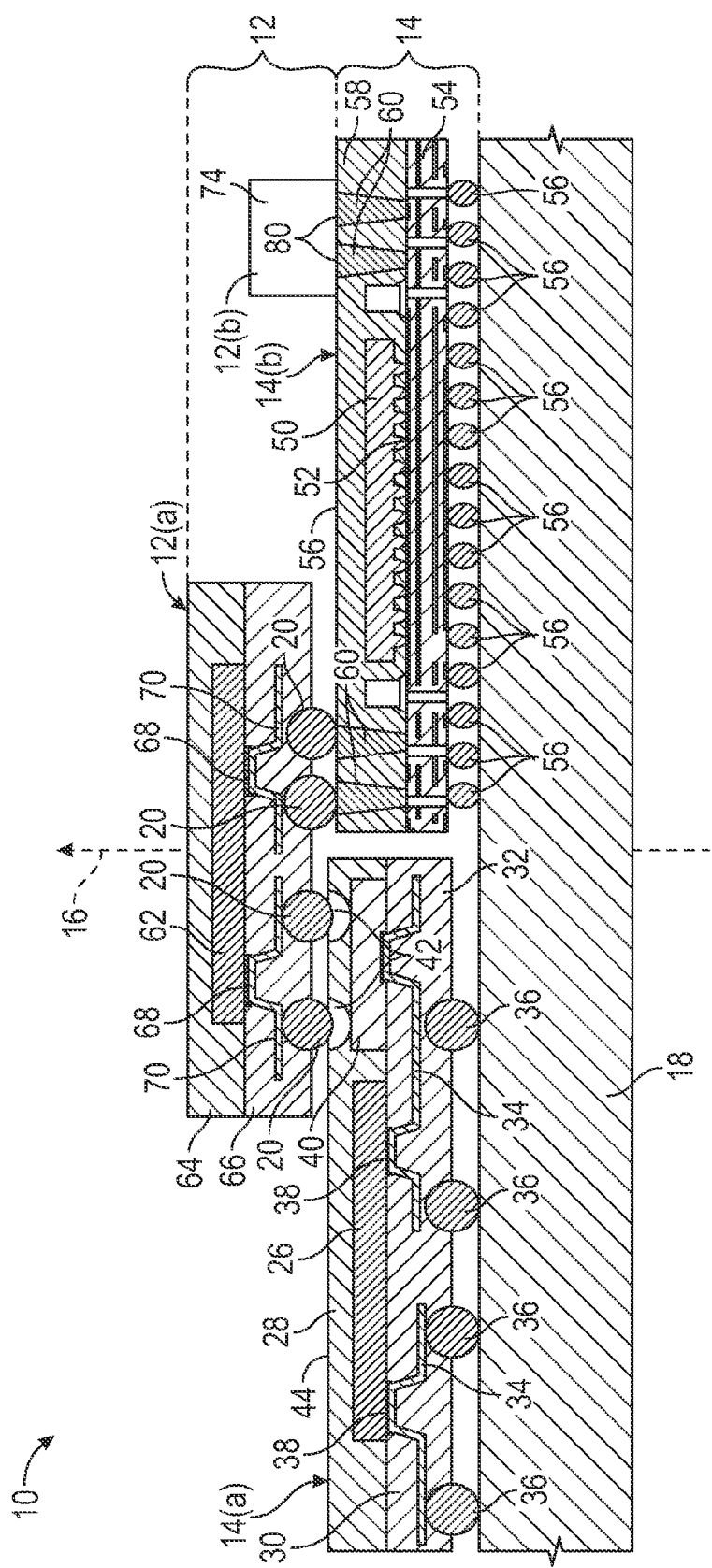

FIGS. 1 and 2 are planform and cross-sectional views, respectively, of a stacked microelectronic package assembly 10, in accordance with an exemplary embodiment of the present invention. Stacked microelectronic package assembly 10 includes a first device layer 12 and a second device layer 14. Device layers 12 and 14 are located at different levels or elevations within package assembly 10, as taken along the centerline of package assembly 10 (represented by dashed line 16 in FIG. 2). Device layer 12 is stacked onto device layer 14, which is, in turn, mounted to and electrically interconnected with a Printed Circuit Board (PCB) 18 or another suitably-routed substrate, such as an interposer. In view of this stacked arrangement, device layers 12 and 14 are also referred to herein as "stacked device layer 12" and "base device layer 14," respectively. Device layers 12 and 14 are generally distributed along different horizontally-extending planes, which are orthogonal to and spaced apart along package centerline 16. However, as discussed more fully below, the devices (e.g., microelectronic packages) contained within base device layer 14 can have varying thicknesses or heights such that the device or devices contained within stacked device layer 12 can be distributed along different horizontal planes, which may not precisely coplanar, but will typically be in relatively close proximity as taken along centerline 16.

Device layers 12 and 14 can each include any number and type of microelectronic devices. In the illustrated embodiment, base device layer 14 contains a plurality of microelectronic packages and is consequently referred to hereafter as "base package layer 14." As shown most clearly in FIG. 1, base package layer 14 contains a total of four microelectronic packages 14(*a*)-(*d*). Base layer packages 14(*a*)-(*d*) are arranged in two dual package rows and each have substantially equivalent planform dimensions in the present example; however, the dimensions of packages and the manner in which such packages are arranged will vary amongst embodiments. Base layer packages 14(*a*)-(*d*) are placed adjacent one another in a non-contacting relationship such that a predetermined lateral spacing or clearance is provided between neighboring packages; the term "lateral," as appearing herein, referring to a direction orthogonal to a plane containing package centerline 16 (FIG. 2). Specifically, base layer packages 14(*a*)-(*d*) are spaced laterally such that lateral clearances or gaps 18 are created between the neighboring package sidewalls. Gaps 18 are preferably left as unfilled voids or air gaps to maximize the cumulative area of the air-exposed surfaces of stacked microelectronic package assembly 10 available for conductive heat transfer to thereby improve heat dissipation from package assembly 10. In one embodiment, the width of the lateral gaps between base layer packages 14(*a*)-(*d*) can range from a minimum spacing of about 100 microns (μm) to a relatively large maximum spacing of, for example, about 30,000 μm. In other embodiments, lateral gaps 18 between base layer packages 14(*a*)-(*d*) can be greater or less than the aforementioned range; or base layer packages 14(*a*)-(*d*) can be placed in a contacting relationship.

At least two of base layer packages 14(*a*)-(*d*) are electrically joined to at least one device contained within stacked device layer 12; the term "electrically joined," as appearing herein, referring to a mechanical and electrical connection formed between the terminals of two or more microelectronic devices, such as packages 14(*a*)-(*d*) and the devices of stacked package layer 12. The microelectronic devices are preferably electrically joined by soldering, but other electrical joinder techniques can be utilized in certain embodiments; e.g., in alternative embodiments, the stacked microelectronic components can be joined utilizing an electrically conducive adhesive, such as a metal-filled epoxy. In the exemplary embodiment illustrated in FIGS. 1-2, all four of base layer packages 14(*a*)-(*d*) are electrically joined to a first microelectronic package 12(*a*) contained within stacked device layer 12 and stacked onto base package layer 14. This may be appreciated most readily with reference to FIG. 1 wherein dashed circles 20 represent terminals (e.g., ball conductors, such as solder balls) of overlying package 12(*a*), which have been soldered to or otherwise electrically joined to aligning terminals of base layer packages 14(*a*)-(*d*). As described more fully below, the terminals of base layer packages 14(*a*)-(*d*) can assume the form of backside contacts, which are located on or exposed at the respective backside surfaces of packages 14(*a*)-(*d*). The backside contacts of base layer packages 14(*a*)-(*d*) are preferably solder contacts; that is, contacts amenable to electrical and mechanical connection utilizing a solder reflow process.

As previously stated, base package layer 14 can and typically will contain different types of microelectronic packages; that is, packages that vary in function and design, as well as in the approach or technique utilized to produce the package. Notably, this allows base layer packages 14(*a*)-(*d*) to be purchased from different suppliers on an as-needed basis, which can be advantageous in certain cases. The internal structures of base layer packages 14(*a*)-(*b*) are shown in cross-section in FIG. 2 and will be described below to establish an exemplary context in which embodiments of the present invention may be better understood. The following description notwithstanding, it is emphasized that base package layer 14 can contain other types of packages having backside contacts in further embodiments including other types of Fan-Out Wafer Level Packages (FO-WLPs) and Fan-In Wafer Level Packages (FI-WLPs) including, but not limited to Chip Scale Packages (CSPs), Ball Grid Array (BGA) packages, and lead-frame packages. Base layer packages 14(*c*)-(*d*) can be similar to base layer packages 14(*a*)-(*b*) in general design; consequently, the following description is equally applicable thereto.

With continued reference to the exemplary embodiment shown in FIGS. 1-2, and as shown most clearly in FIG. 2, base layer package 14(*a*) is produced using a molded panel FO-WLP packaging approach. Base layer package 14(*a*) includes a semiconductor die 26, which is embedded or encapsulated in a molded body 28. A number of redistribution layers (RDLs) 30 are produced over the frontside of molded body 28 at which die 26 is exposed, which is the lower surface of body 28 in FIGS. 1-2 as package 14(*a*) is mounted to PCB 18 in an inverted orientation. RDLs 30 include a dielectric body 32 containing a number of metal routing features 34 commonly referred to as "interconnect lines." Interconnect lines 34 provide signal and power routing from the bond pads 38 of die 26 to a contact array 36 (e.g., a BGA), which is formed over RDLs 30 opposite molded body 28 and soldered to corresponding contacts on PCB 18 (not shown).

Interconnect lines 34 can further provide electrical interconnection to other devices or components embedded within body 28, such as ground planes, SMDs, pre-placed vias, antenna structures, other die, MEMS devices, and the like. In the case of microelectronic package 14(*a*), specifically, at least one substrate Pre-Place Via (sPPV) 40, 42 is embedded within molded body 28 and electrically coupled to die 26 by one or more interconnect lines 34. sPPV 40, 42 includes: (i) a base piece 40, which contains electrical routing (not shown), and (ii) a number of solder balls 42, which have been deposited at selected locations onto base piece 40. Collectively, the routing of base piece 40 and solder balls 42 provide electrically conductive paths extending from the frontside of molded body 28 to the backside 44 thereof. As further shown in FIG. 2, solder balls 40 are exposed at the backside 44 of molded body 28, which has been ground or otherwise thinned to reveal balls 40. Upper portions of solder balls 40 have been removed by virtue of the thinning process providing relatively large surface areas or "landing pads" facilitating subsequent interconnection. Solder balls 40 and, more generally, sPPV 40, 42 thus provide a plurality of backside contacts, which are located within the fan-out region of package 14(*a*) and can soldered or otherwise joined to the terminals of stacked bridge device 12(*a*). To facilitate interconnection with stacked bridge package 12(*a*), sPPV 40, 42 can be formed in the fan-out region of package 14(*a*) located adjacent base layer package 14(*b*).

By way of non-limiting example, one process suitable for producing base layer package 14(*a*) can be carried-out as follows. First, semiconductor die 26, base sPPV piece 40, and other microelectronic devices (e.g., other die and other base sPPV pieces) are positioned on a temporary substrate. Solder balls 40 are deposited on base sPPV piece 40 and the other non-illustrated sPPV pieces. An overmolding process is then performed to produce a molded panel containing the encapsulated microelectronic devices. The backside of the molded panel can then be thinned by, for example, grinding to reveal solder balls 40 and complete fabrication of sPPVs 40, 42. Alternatively, panel thinning can be performed after build-up of RDLs 30. The molded panel can then be thermally released or otherwise removed from the temporary substrate, inverted, and subject to RDL build-up. RDLs 30 can be produced by, for example, spinning-on or otherwise depositing one or more dielectric layers collectively forming dielectric body 32 and interspersed with one or more metal levels forming interconnect lines 34. Interconnect lines 34 can be produced utilizing well-known lithographical patterning and conductive material (e.g., copper) deposition techniques. Afterwards, openings can be formed in the outermost or last RDL (e.g., a solder mask layer) by lithographical patterning, and a ball attach and solder reflow processes can be carried-out to produce BGA 36. The panel can then be singulated (e.g., by sawing, laser cutting, water jetting, or the like) to produce a plurality of discrete FO-WLPs including completed microelectronic package 12(a) shown in FIGS. 1-2. Molded body 28, then, can be regarded as a singulated piece of a larger molded panel utilized to produce a number of other FO-WLPs in parallel with package 12(a). Additional description of the production of FO-WLPs including sPPVs can be found in U.S. Pub. 2013/0154091 entitled "SEMICONDUCTOR DEVICE PACKAGING USING ENCAPSULATED CONDUCTIVE BALLS FOR PACKAGE-ON-PACKAGE BACK SIDE COUPLING," filed on Dec. 14, 2011, and assigned to the assignee of the instant Application.

As is base layer package 14(a), base layer package 14(b) is a FO-WLP; however, base layer package 14(b) is produced utilizing a different packaging approach and contains a different type of backside contact. Specifically, in the case of base layer package 14(a), a flip chip approach is utilized wherein a semiconductor die 50 having a BGA 52 is inverted and soldered to an interposer 54. A second, larger BGA 56 is formed over the frontside of interposer 54 and soldered to PCB 18, while a molded body 58 is formed over the backside of interposer 54 to encapsulate die 50. A number of Through Mold Vias (TMVs) 60 are formed in the fan-out regions of molded body 58 and provide routing from interposer 54 to the backside 56 of molded body 58. As can be seen in FIG. 2, TMVs 60 are exposed at backside 56 of microelectronic package 14(b) to form backside contacts. TMVs 60 can be produced from a deposited solder and thus may constitute so-called "solder contacts," which can be joined to the terminals (e.g., the solder balls of BGA 20) of overlying microelectronic package 12(a) utilizing a solder reflow process. During manufacture, microelectronic package 14(b) can be produced by first mounting die 50 to interposer 54, dispensing and curing an encapsulant around die 50 to form molded body 58, producing TMVs 60 (e.g., utilizing a fill and drill process), and subsequently producing outer BGA 56 utilizing a ball attach process. In other embodiments, base layer package 14(b) and TMVs 60 can be produced utilizing a different approach. Further discussion of manners in which FO-WLPs can be produced including TMVs can be found in U.S. Pat. No. 8,222,538 B1 entitled "STACKABLE VIA PACKAGE AND METHOD," issued Jul. 17, 2012, and assigned to Amkor Technologies, Inc. In further embodiments, base layer package 14(b), base layer package 14(a), or another base layer package can be produced to contain a different type of backside contact, such as a plated metal (e.g., copper) pillar or a Through Silicon Via (TSV).

Stacked bridge device 12(a) can be any microelectronic device or component usefully stacked onto and electrically interconnected with base layer packages 14(a)-(d) to provide package assembly 10. Such devices include additional microelectronic packages, discrete or passive SMDs, optical devices, MEMS devices, and prefabricated antenna structures, to list but a few examples. In the illustrated embodiment, stacked bridge device 12(a) assumes the form of a microelectronic package and, specifically, a FO-WLP. As the structural features of bridge device 12(a) are similar to those of previously-described base layer package 14(a), the structural features of bridge device 12(a) will not be described detail other than to note the following. Bridge device 12(a) contains a semiconductor die 62 embedded in a molded body 64 and over which a number of RDLs 66 are formed. In one embodiment, die 62 is a heat sensitive (e.g., memory) die (that is, a die having a thermal tolerance less than the thermal tolerance of die 26 contained within base layer package 14(a) and/or less than the thermal tolerance of die 50 contained within base layer package 14(b)), which is desirably thermally isolated from the heat concentration occurring within base package layer 14.

A BGA containing solder balls 20 is produced over RDLs 66 opposite molded body 64. The BGA solder balls 20 are electrically coupled to the bond pads 68 of die 62 by interconnect lines 70 contained within RDLs 66. Stacked bridge device 12(a) is positioned over both base package layer 14(a) and base package layer 14(b) such that the body of device 12(a) spans the interface or gap 18 (FIG. 2) between package layers 14(a)-(b). Additionally, as shown in FIG. 1, bridge device 12(a) is likewise positioned over package layers 14(c)-(d) and further spans or extends over the gaps 18 provided between package layers 14(a) and 14(b), between package layers 14(a) and 14(c), and between package layers 14(b) and 14(d). The solder balls of BGA 20 are soldered mounted to the backside contacts of base package layer 14(a) (provided in the form of sPPV 40, 42), the backside contacts of base package layer 14(b) (provided in the form of TMVs 60), and the non-illustrated backside contacts of base package layers 14(c)-(d), which can likewise be produced as sPPVs, TMVs, or another electrically conductive feature providing signal or power communication to the backside of layer packages 14(c)-(d). By virtue of this design, any combination of package layers 14(a)-(d) can be electrically coupled through bridge device 12(a), and bridge device 12(a) can be electrically coupled to PCB 18 through any combination of package layers 14(a)-(d). If desired, a non-conductive underfill material can be dispensed beneath stacked bridge device 12(a) and around BGA solder balls 20 for increased solder joint reliability.

Stacked device layer 12 can include a single bridge device (e.g., bridge device 12(a)) in embodiments. In the exemplary embodiment illustrated in FIGS. 1-2, stacked device layer 12 includes a second bridge device 12(b), which is provided in the form of an SMD and which is consequently referred to as "SMD 12(b)" hereafter. As shown most clearly in FIG. 2, SMD 12(b) can be two terminal devices including a body 72 having a generally rectangular shape when viewed from the side, top, or bottom. SMD body 72 is flanked by two opposing electrically-conductive end terminals 74 and 76. SMD 12(b) can be discrete or passive resistor, capacitor, inductor, or diode. In one embodiment, SMD 12(b) assumes the form of a discrete capacitor (commonly referred to as a "chip capacitor" or, more simply, a "chip cap") each including an electrically-insulative (e.g., ceramic) body disposed between two electrically-conductive end pieces; i.e., terminals 74 and 76 in the case of SMD 12(b). In other embodiments, SMDs 12(b) can assume the form of a two-terminal chip inductor or a two-terminal chip resistor having the generally rectangular form factor illustrated in FIGS. 1-2. The SMD terminals are composed of an electrically-conductive material and can have various different surface finishes, such as tin, copper, gold, nickel, conductive epoxy, palladium, silver, and lead-based finishes, to list but a few examples.

As does bridge device 12(a), SMD 12(b) extends over at least two microelectronic packages in base package layer 14 and spans the lateral gap separating the packages. Specifically, SMD 12(*b*) extends over and is electrically joined to adjacent base layer packages 14(*b*) and 14(*d*). End terminals 74 and 76 of SMD 12(*b*) are further soldered or otherwise electrically joined to backside contacts provided on or exposed at the respective backsides of base layer packages 14(*b*) and 14(*d*). The backside contacts of base layer package 14(*b*) soldered to SMD end terminal 74 are represented in FIG. 1 by dashed circles 80. Similarly, the backside contacts of base layer package 14(*b*) soldered to SMD end terminal 74 are represented in FIG. 1 by dashed circles 82. Backside contacts 80 of base layer package 14(*b*) are further shown in cross-section in FIG. 2. As can be seen in FIG. 2, backside contacts 80 are formed by additional TMVs 60 similar or identical to those forming the backside contacts to which bridge device 12(*a*) is electrically joined. Backside contacts 82 of base layer package 14(*d*) can be produced as TMVs, produced as sPPVs similar to those described above in conjunction with base layer package 14(*a*) and shown in FIG. 2, or produced as another type of backside contact. As further indicated in FIGS. 1 and 2, two or more backside contacts can be joined to each terminal of SMD 12(*b*), depending upon the dimensions of the SMD terminals and the design of stacked microelectronic package assembly 10. This can beneficially enhance solder joint reliability in embodiments wherein multiple backside contacts are joined to a single terminal of SMD 12(*b*) (or another bridge device contained within stacked device layer 12) by soldering.

Stacked package layer 12 can include any number of additional bridge devices in more complex embodiments of stacked microelectronic package assembly 10. Further, stacked package layer 12 can include microelectronic devices that do not span or extend over at least two underlying packages and are consequently not considered "bridging devices," as this term is used herein. For example, as indicated in FIG. 1, stacked package layer 12 can further include an additional SMD 12(*c*), which is exclusively supported by a single base layer package 14(*c*). The terminals 84 of SMD 12(*c*) can be soldered or otherwise electrically joined to additional backside contacts provided on SMD 12(*c*), as generically represented in FIG. 1 by dashed circles 86. In further embodiments, any number of additional SMDs or other microelectronic components can likewise be stacked onto the backsides of base layer devices 14(*a*)-(*d*) and electrically interconnected to additional backside contacts provided on devices 14(*a*)-(*d*). In still further embodiments, two or more of the devices contained within stacked package layer 12 can be electrically interconnected with one another utilizing wire bonds, solder connections, printed traces, or the like. Additional packages can further be stacked onto stacked player layer 12 to impart stacked package assembly 10 with three or more package layers in more complex embodiments.

The stacked bridge device can be produced to have solder terminals (e.g., solder balls) having sufficient heights or diameters to compensate for variations in the thicknesses of the base layer packages or instances wherein the package backsides are not precisely coplanar. For example, and with continued reference to FIG. 2, it can be seen that the backside surfaces of base layer packages 14(*a*)-(*b*) are not precisely coplanar. Instead, base layer package 14(*a*) is slightly thicker than is base layer package 14(*b*) such that its backside surface 44 is located at a slightly higher elevation than is the backside surface 56 of adjacent base layer package 14(*b*). Stated differently, package layers 14(*a*)-(*b*) are produced and disposed within package assembly 10 such that their respective backsides are located in different planes have a predetermined vertical offset; the term "vertical," as appearing herein, defined as a direction as parallel to package centerline 16 (FIG. 2). Nonetheless, the diameter of solder balls 20 exceed this disparity in elevation such that a solder connection is readily made by bridge device 12(*a*) when soldered to base layer packages 14(*a*)-(*d*). The maximum offset in elevation between the backsides of base layer packages 14(*a*)-(*d*) for which BGA solder balls 20 can compensate will vary in conjunction with solder ball diameter, package-to-package spacing, and other dimensions. Additionally, a greater disparity in vertical offset between package backsides can typically be accommodated in embodiments wherein the backside solder contacts are imparted with an increased diameter. By way of non-limiting example, the respective backsides of base layer packages 14(*a*)-(*b*) can be vertically offset (that is, offset as taken along centerline 16) from about 1 µm to about 100 µm in an embodiment. In further embodiments, the vertically offset can be greater than or less than the aforementioned range or the respective backsides of packages 14(*a*)-(*b*) (and the other packages in base package layer 14) can be coplanar.

The foregoing has thus provided embodiments of a stacked microelectronic package assembly including at least one bridge device, which is stacked onto and electrically interconnected with at least two microelectronic packages contained within a base package layer. The base layer microelectronic packages are advantageously produced to have backside contacts that can be joined to the terminals of the bridge device (e.g., conductive end terminals when the bridge device assumes the form of an SMD or the contacts of a contact array when the bridge device assumes the form of a microelectronic package) utilizing a solder connection, although other electrical mount connections can be employed in alternative embodiments. The backside contacts can be produced as sPPVs, TMVs, or any other feature providing an electrical point-of-contact on the backside of the base layer packages, such as plated metal (e.g., copper) pillars or TSVs. Additionally, the backside contacts can be provided at any suitable location on the base layer packages and are usefully provided in the outer edge regions of the packages; e.g., in the fan-out region for base layer packages produced as FO-WLPs. The base layer packages can be separated by lateral air gaps to increase the surface area available for convective heat transfer to the ambient environment. Additionally, the stacked bridge device can be produced to have solder terminals (e.g., solder balls) having sufficient heights or diameters to compensate for variations in the thicknesses of the base layer packages. In this manner, microelectronic package assemblies can be produced to have 3D package architectures combining multiple die-containing packages and possibly other devices (e.g., SMDs) for high levels of functionalities, while permitting efficient heat dissipation from the package assembly. A high level of design flexibility is further provided as the number, disposition, and type of the stacked bridge devices and the base layer packages can be varied to suite a particular application or purpose.

In one embodiment, the stacked microelectronic package assembly includes a base package layer onto which a stacked bridge device is stacked. The base package layer includes, in turn, a first microelectronic package and a second microelectronic package positioned laterally adjacent the first microelectronic package. The stacked bridge device extends over the first and second microelectronic packages. A first terminal of the stacked bridge device is soldered to or otherwise electrically joined to a first backside contact of the first microelectronic package, and a second terminal of the stacked bridge device is soldered to or otherwise electrically joined to a second backside contact of the second microelectronic package. The backside contacts can be provided as sPPVs, TMVs, TSVs, plated metal (e.g., pillars), or another type of conductor exposed at the respective backsides of the first and second microelectronic packages.

In another embodiment, the stacked microelectronic package assembly includes a base package layer containing first and second FO-WLPs. The first FO-WLP has a first fan-out edge region in which a first backside solder contact is embedded. The second FO-WLP likewise has a second fan-out edge region in which a second backside solder contact is embedded. The second fan-out edge region is positioned adjacent the first fan-out edge region. A bridge device is stacked onto the base package layer, extends over the first and second FO-WLPs, and is soldered to the first and second backside contacts.

Embodiments for manufacturing a stacked microelectronic package assembly have further been described. In one embodiment, the method includes placing a first microelectronic package having a first backside contact adjacent a second microelectronic package having a second backside contact to yield, at least in part, a base package layer. A stacked bridge device is positioned over the base package layer such that the stacked bridge device extends over the first and second microelectronic devices. First and second terminals of the stacked bridge device are then soldered to the first and second backside contacts, respectively. The stacked bridge device can be selected from the group consisting of a discrete capacitor, a discrete resistor, and a discrete inductor. In certain embodiments, the first microelectronic package has a plurality of backside contacts that are soldered to the first terminal of the stacked bridge device. In other embodiments, the stacked bridge device can be selected as a third microelectronic package having a contact array in which the first and second terminals are included. The solder attach process can be carried-out by applying a solder material (e.g., flux or solder paste) onto the areas to be soldered. For example, the solder material can be selectively applied to the terminals (e.g., BGA solder balls or conductive SMD end terminals) of the stacked bridge device by dipping. Alternatively, a pin transfer approach can be used to dispense a flux/solder paste onto the backside contacts of the base layer packages. A solder reflow process can then be carried-out in accordance with a predetermined heating schedule to effectuate the desired solder bonds.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic component" is utilized in a broad sense to refer to an electronic device, element, or structure produced on a relatively small scale and amenable to packaging in the above-described manner. Microelectronic components include, but are not limited to, integrated circuits formed on semiconductor die, MEMS devices, passive electronic microelectronic components, optical devices, and other small scale electronic devices capable of providing processing, memory, sensing, radiofrequency, optical, and actuator functionalities, to list but a few examples. Microelectronic components also include other discrete or separately-fabricated structures that can be integrated into the package, such as preformed via structures and preformed antenna structures.

What is claimed is:

1. A stacked microelectronic package assembly, comprising:
   a base package layer, comprising:
      a first microelectronic package having a first backside contact;
      a second microelectronic package positioned laterally adjacent the first microelectronic package and having a second backside contact;
   a substrate to which the first and second microelectronic packages are mounted in a laterally-spaced relationship such that neighboring sidewalls of the first and second microelectronic packages define an unfilled air gap between the first and second microelectronic packages; and
   a stacked bridge device stacked onto the base package layer opposite the substrate, the stacked bridge device extending from the first microelectronic package to the second microelectronic package to span the unfilled air gap, the stacked bridge device having first and second terminals soldered to first and second backside contacts, respectively.

2. The stacked microelectronic package assembly of claim 1 wherein the first microelectronic package has a first backside, wherein the second microelectronic package has a second backside, and wherein the first and second the backsides are located in different planes separated by a predetermined vertical offset.

3. The stacked microelectronic package assembly of claim 1 wherein the stacked bridge device comprises a third microelectronic package.

4. The stacked microelectronic package assembly of claim 3 wherein the third microelectronic package comprises a ball grid array, and wherein the first and second terminals comprises ball conductors included within the ball grid array.

5. The stacked microelectronic package assembly of claim 3 wherein the first and third microelectronic packages each contain a semiconductor die, and wherein semiconductor die contained within the third microelectronic package has a lower thermal tolerance than does the semiconductor die contained within the first microelectronic package.

6. The stacked microelectronic package assembly of claim 1 wherein the stacked bridge device comprises a discrete Surface Mount Device (SMD).

7. The stacked microelectronic package assembly of claim 6 wherein the SMD comprises:
a first end terminal soldered to the first backside contact; and
a second, opposing end terminal soldered to the second backside contact.

8. The stacked microelectronic package assembly of claim 7 wherein the first microelectronic package comprises multiple backside contacts to which the first end terminal of the SMD is joined.

9. The stacked microelectronic package assembly of claim 6 wherein the discrete SMD is selected from the group consisting of a discrete capacitor, a discrete resistor, and a discrete conductor.

10. The stacked microelectronic package assembly of claim 1 wherein base package layer further comprises a third microelectronic package positioned laterally adjacent at least one of the first and second microelectronic package, and wherein the third microelectronic package further comprises a third backside contact to which the stacked bridge device is electrically joined.

11. The stacked microelectronic package assembly of claim 10 wherein the first and second microelectronic packages are arranged in a first row, and wherein base package layer further comprises a fourth microelectronic package arranged with third microelectronic in a second row.

12. The stacked microelectronic package assembly of claim 1 wherein the first microelectronic package comprises a Fan-Out Wafer Level Package (FO-WLP) having a molded body, and wherein the first backside contact comprises a solder ball embedded in the molded body and exposed through a ground backside surface thereof.

13. A stacked microelectronic package assembly, comprising:
a base package layer, comprising:
a first Fan-Out Wafer Level Package (FO-WLP) having a first fan-out edge region in which a first backside solder contact is embedded; and
a second FO-WLP having a second fan-out edge region in which a second backside solder contact is embedded, the second fan-out edge region positioned adjacent the first fan-out edge region; and
a stacked bridge device stacked onto the base package layer, extending over the first and second FO-WLPs, and soldered to the first and second backside contacts.

14. The stacked microelectronic package assembly of claim 13 wherein the first FO-WLP comprises:
a backside surface; and
a substrate preplaced via embedded in the first fan-out edge region and exposed through the backside surface to define the first backside contact.

15. The stacked microelectronic package assembly of claim 13 wherein the first FO-WLP is electrically coupled to the second FO-WLP through the stacked bridge device.

16. The stacked microelectronic package assembly of claim 13 wherein the first FO-WLP contains a semiconductor die having a first thermal tolerance, and wherein the stacked bridge device contains a memory die having a second thermal tolerance less than the first thermal tolerance.

17. A method for manufacturing a stacked microelectronic package assembly, comprising:
placing a first microelectronic package having a first backside contact adjacent a second microelectronic package having a second backside contact to yield, at least in part, a base package layer;
positioning a stacked bridge device over the base package layer such that the stacked bridge device extends over the first and second microelectronic devices; and
soldering first and second terminals of the stacked bridge device to the first and second backside contacts, respectively;
wherein placing comprises mounting the first and second microelectronic packages to a substrate in a laterally-spaced relationship such that an unfilled air gap is formed between neighboring sidewalls of the first and second microelectronic packages, the stacked bridge device spanning the unfilled air gap when positioned over the base package layer and soldered to the first and second backside contacts of the first and second microelectronic packages.

18. The method of claim 17 further comprising selecting the stacked bridge device from the group consisting of a discrete capacitor, a discrete resistor, and a discrete inductor.

19. The method of claim 18 wherein the first microelectronic package has a plurality of backside contacts, and wherein the soldering comprises soldering the plurality of backside contacts to the first terminal of the stacked bridge device.

20. The method of claim 17 further comprising selecting the stacked bridge device to be a third microelectronic package having a contact array in which the first and second terminals are included.

\* \* \* \* \*